United States Patent
Rodriguez et al.

(10) Patent No.: US 10,276,483 B2
(45) Date of Patent: Apr. 30, 2019

(54) COAXIAL VIAS

(71) Applicant: INTEL CORPORATION, Santa Clara, CA (US)

(72) Inventors: Adrian Rodriguez, Citrus Heights, CA (US); Christopher F. Kinney, Folsom, CA (US); Matthew G. Priolo, Folsom, CA (US); Tianlong Henry Chen, El Dorado Hills, CA (US)

(73) Assignee: INTEL CORPORATION

( * ) Notice: Subject to any disclaimer, the term of this patent is extended or adjusted under 35 U.S.C. 154(b) by 0 days.

(21) Appl. No.: 15/748,466

(22) PCT Filed: Aug. 31, 2015

(86) PCT No.: PCT/US2015/047823
§ 371 (c)(1),
(2) Date: Jan. 29, 2018

(87) PCT Pub. No.: WO2017/039631
PCT Pub. Date: Mar. 9, 2017

(65) Prior Publication Data
US 2018/0226328 A1    Aug. 9, 2018

(51) Int. Cl.
| | | |
|---|---|---|
| *H01L 23/498* | (2006.01) |
| *H01L 21/48* | (2006.01) |
| *H01L 23/48* | (2006.01) |
| *H01L 21/768* | (2006.01) |
| *H01L 23/14* | (2006.01) |

(Continued)

(52) U.S. Cl.
CPC ...... *H01L 23/49822* (2013.01); *H01L 21/486* (2013.01); *H01L 21/76898* (2013.01); *H01L 23/145* (2013.01); *H01L 23/481* (2013.01); *H01L 23/49827* (2013.01); *H01L 24/16* (2013.01); *H05K 1/0222* (2013.01); *H01L 2224/16225* (2013.01); *H01L 2924/15311* (2013.01)

(58) Field of Classification Search
CPC ............ H01L 21/76898; H01L 23/481
USPC ........................................... 257/774
See application file for complete search history.

(56) References Cited

U.S. PATENT DOCUMENTS

| | | | |
|---|---|---|---|
| 2006/0001174 A1* | 1/2006 | Matsui | H01L 21/76898 257/774 |
| 2008/0113505 A1* | 5/2008 | Sparks | H01L 21/76898 438/637 |

(Continued)

OTHER PUBLICATIONS

International Search Report and Written Opinion dated Jun. 13, 2016 for International Application No. PCT/US2015/047823, 13 pages.

*Primary Examiner* — David Vu
*Assistant Examiner* — Brandon C Fox
(74) *Attorney, Agent, or Firm* — Schwabe, Williamson & Wyatt, P.C.

(57) ABSTRACT

Embodiments herein may relate to a substrate that includes a coaxial via with a signal portion and a ground shield portion. In embodiments, the via may further include a pad that is coupled with the signal portion. The pad and the ground shield portion may not be coplanar with one another. In embodiments, the substrate may have a plurality of vias that may be formed in a staged and/or skipped manner. Other embodiments may be described and/or claimed.

19 Claims, 9 Drawing Sheets

(51) Int. Cl.
    *H01L 23/00*     (2006.01)
    *H05K 1/02*     (2006.01)

(56) References Cited

U.S. PATENT DOCUMENTS

| | | | |
|---|---|---|---|
| 2009/0267183 A1* | 10/2009 | Temple | H01L 21/76898 257/532 |
| 2010/0308435 A1* | 12/2010 | Nowak | H01L 21/76898 257/532 |
| 2012/0258589 A1 | 10/2012 | Volant et al. | |
| 2013/0040436 A1 | 2/2013 | Nowak et al. | |
| 2014/0199834 A1 | 7/2014 | Gu et al. | |
| 2014/0367828 A1* | 12/2014 | Colonna | H01L 28/40 257/532 |
| 2015/0028482 A1 | 1/2015 | Ning et al. | |
| 2015/0084194 A1* | 3/2015 | Molzer | H01L 23/481 257/741 |

* cited by examiner

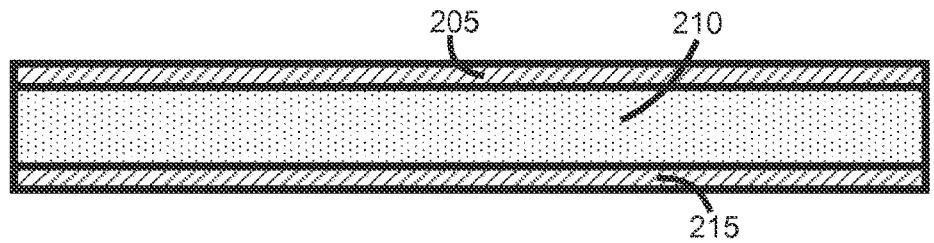
Figure 2-A
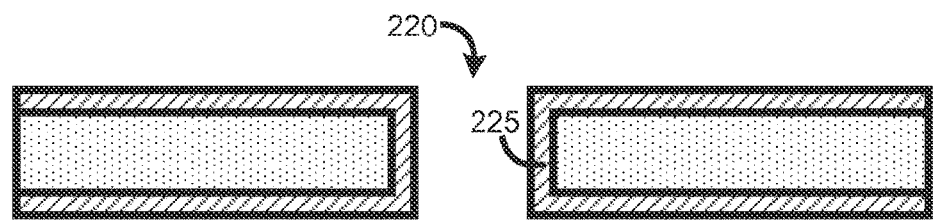
Figure 2-B
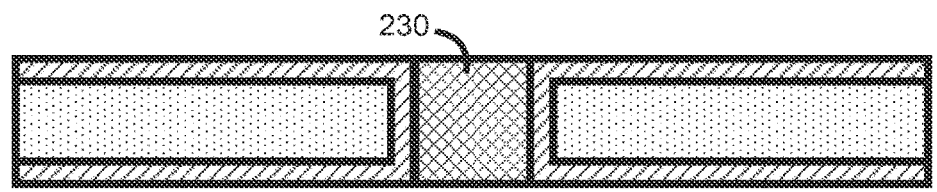
Figure 2-C

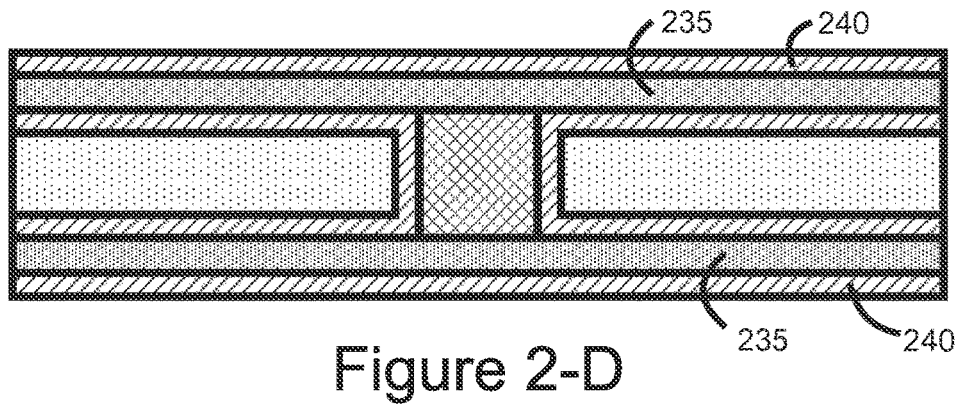
Figure 2-D
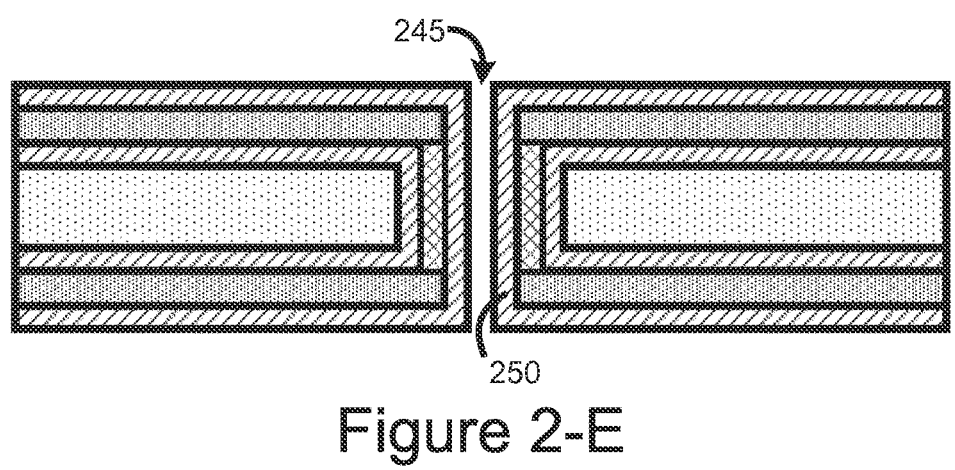
Figure 2-E
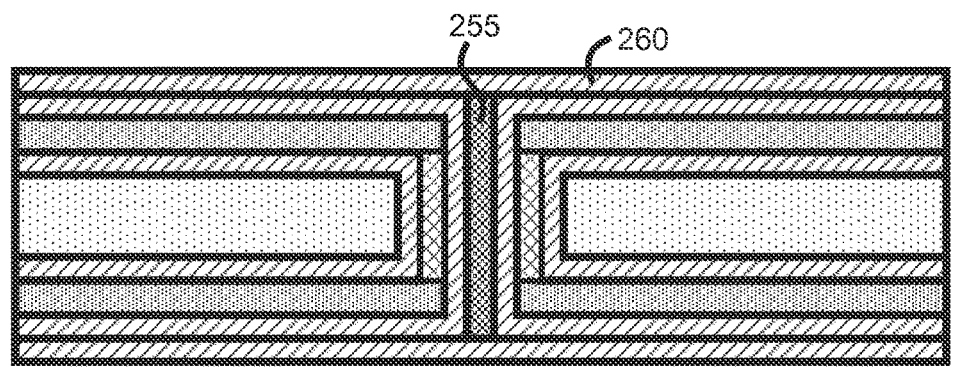
Figure 2-F

COAXIAL VIAS

CROSS REFERENCE TO RELATED APPLICATIONS

The present application is a national phase entry under 35 U.S.C. § 371 of International Application No. PCT/US2015/047823, filed Aug. 31, 2015, entitled "COAXIAL VIAS", which designated, among the various States, the United States of America. The Specifications of the PCT/US2015/047823 Application is hereby incorporated by reference.

TECHNICAL FIELD

The present disclosure relates generally to the field of integrated circuit (IC) packages, and more particularly to the coaxial vias used in IC packages.

BACKGROUND

Vias may be used to transfer power and signals vertically through packages and circuit boards. However, via-to-via crosstalk may be detrimental to buses at high data rates. Further, the crosstalk may increase in severity for longer and tightly spaced vias. Generally, coaxial vias may be used to decrease the via crosstalk through the use of an outer ground shield and an inner conductor. Crosstalk may be a particular problem in packages that include vias that have a pitch less than 0.5 millimeters (mm), which may make the use of coaxial vias desirable. As used herein, pitch may refer to the distance from the center of one via to the center of another adjacent via.

However, most coaxial vias may be difficult to manufacture in sub 0.5 mm pitches. This difficulty may be because the vias may require a relatively large pad that can be used to electrically and/or physically couple the via with another component. The use of a relatively large pad may require the ground shield to have a relatively large circumference. The relatively large circumference may make drilling multiple vias in a substrate difficult, because the webbing, that is the portion of the substrate between the vias, may become very thin and structurally unstable during the manufacturing process.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2-A, 2-B, 2-C, 2-D, 2-E, and 2-F are simplified cross-sectional side views of stages of manufacturing the coaxial via of FIG. 1, in accordance with various embodiments.

DETAILED DESCRIPTION

Embodiments may include a substrate with one or more coaxial vias. In embodiments, the coaxial vias may include a ground shield portion and a signal portion. The signal portion may be coupled with a pad. In embodiments, the pad and the ground shield portion may not be coplanar with one another. In some embodiments, various of the vias may be deposited in a staged or skipped manner.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Figure 1:
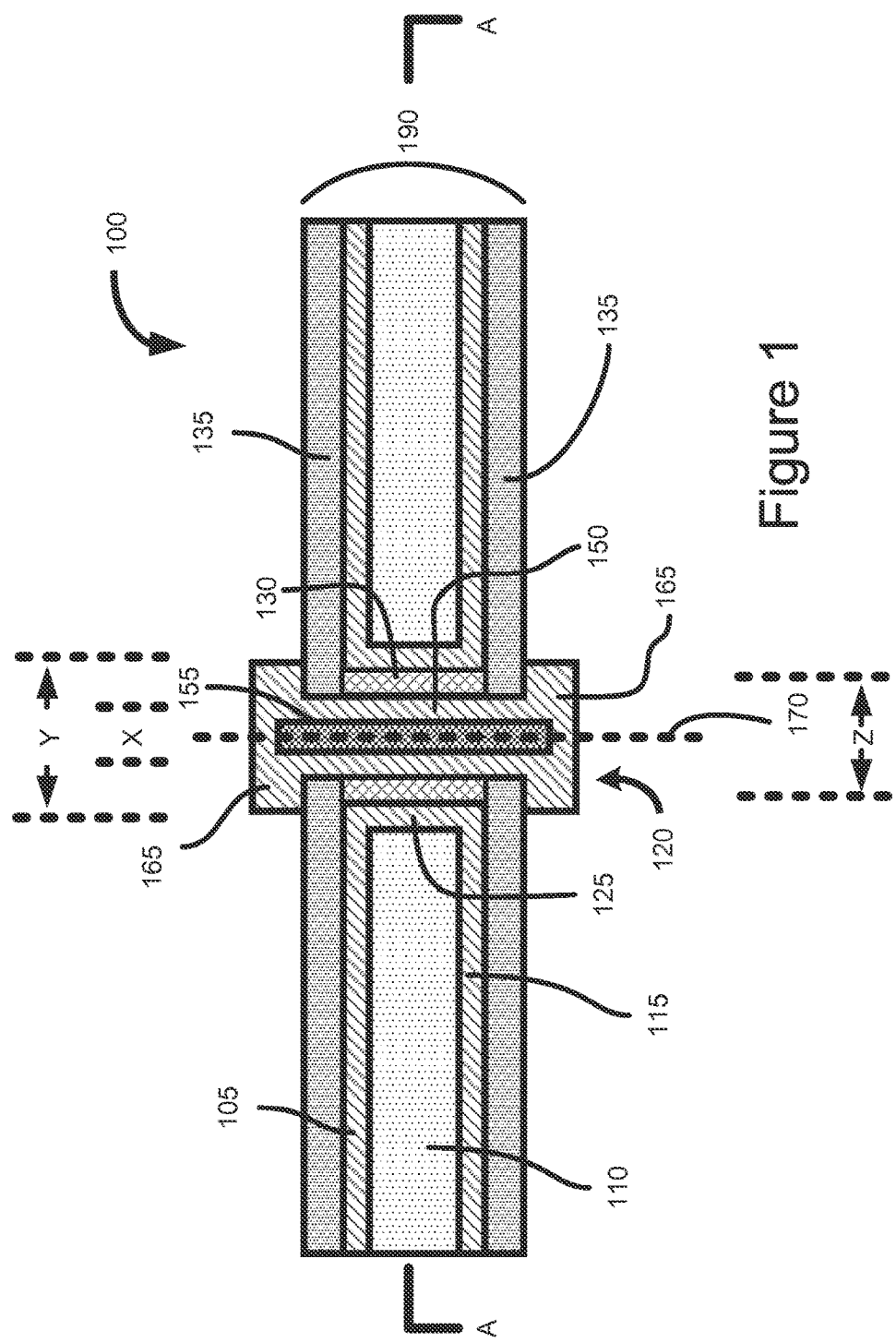
FIG. 1 is a simplified cross-sectional side view of a coaxial via, in accordance with various embodiments.

FIG. 1 is a simplified cross-sectional side view of a coaxial via 120, in accordance with various embodiments. Generally, the image depicted in FIG. 1 is both horizontally and vertically symmetrical. For example, the image may be viewed as symmetrical about the axis 170. Therefore only certain pieces or parts may be specifically enumerated, and otherwise be understood to be present at other un-numbered parts of the Figure. For example, resin 130 may only be labeled on the right portion of FIG. 1, but may be understood to also be present on the left portion of FIG. 1 as depicted by a similarly shaped and shaded element in FIG. 1. This labeling is for the sake of clarity and ease of viewing the Figure, and is not intended to restrict or limit the spirit or scope of the embodiment depicted in the Figure.

Generally, a package 100 may include a substrate core layer 110. The substrate core layer 110 may be a substrate core layer of a substrate 190 used in, on, or as part of a patch, a die, an interposer, a printed circuit board (PCB), a spacer, and/or some other type of substrate of a package. Generally, the substrate core layer 110 may be formed of some electrically and/or thermally neutral dielectric material such as a resin, epoxy, polytetrafluoroethylene (PTFE), or some other material. Example materials may include an epoxy material such as an FR-4 material. Generally, the resin or epoxy may surround a glass fabric weave. The resin or epoxy may be allowed to flow and set up solid under a specific temperature and/or pressure. In some cases, the PTFE or some similar material may not include the glass weave.

The substrate core layer 110 may be between a conductive ground material that includes a top layer 105, a bottom layer 115, and a ground shield portion 125 of coaxial via 120. As noted earlier, FIG. 1 is a simplified cross-sectional side view, and so it will be understood that the ground shield portion 125 may be circular or some other shape when viewed from the top of the package 100, and have a diameter that is denoted as Y. In some embodiments, the top layer 105 and/or the bottom layer 115 may have additional interconnect dielectric and metal layers (not shown) above and/or below the coaxial via 120. These additional layers are not shown for the sake of clarity of the Figure. The ground shield portion 125 may have an axis that is generally coaxial with axis 170. In specific embodiments, the diameter of the ground shield portion 125 may be based on variables such as a fabrication registration tolerance (e.g., the minimum of the fabrication registration tolerance), a fabrication web tolerance (e.g., a maximum of the fabrication registration tolerance), and/or a desired pitch. In some embodiments, the diameter of the ground shield portion 125 may be approximately 13 mils, though in other embodiments the diameter of the ground shield portion 125 may be higher or lower. For example, in some embodiments the diameter of the ground shield portion 125 may be between approximately 10 mils and 15 mils.

The top layer 105 and bottom layer 115 may be traces, lines, or some other configuration of conductive material to couple the ground shield portion 125 to one or more other components or elements of the package 100 or an electronic device with which the package 100 is coupled. In some embodiments, the top layer 105 and/or bottom layer 115 may be considered to be ground layers. In embodiments, the top layer 105, bottom layer 115, and or ground shield portion may be copper, gold silver, aluminum, lead, or some other similar material. In some embodiments, the ground shield portion may be or may include a solder material.

The via 120 may further include a signal portion 150. Similarly to the ground shield portion 125, the signal portion 150 may be generally circular or some other shape when viewed from the top of the package 100. The signal portion 150 may have a diameter, which is denoted as X in FIG. 1. The diameter may be smaller than the diameter Y of ground shield portion 125. In specific embodiments, the diameter of the signal portion 150 may be approximately 5 mils, though in other embodiments the diameter of the signal portion 150 may be higher or lower. As can be seen in FIG. 1, the signal portion 150 may have an axis that may be coaxial with axis 170 and the axis of the ground shield portion 125.

Between the ground shield portion 125 and the signal portion 150, the substrate 190 may further include a resin 130 which may be, for example, a non-conductive epoxy resin. The resin 130 may generally laterally encapsulate the signal portion 150, and electrically isolate the signal portion 150 from the ground shield portion 125. Generally, the dielectric constant of the resin 130 may substantially affect the overall impedance of the coaxial via 120.

The substrate 190 may further include a pre-preg layer 135 on either side of the substrate 190. Specifically, the pre-preg layers 135 may serve to electrically and thermally isolate the top layer 105 the bottom layer 115, and the ground shield portion 125 to the internal area of the substrate 190. Although not shown, the top layer 105 and/or bottom layer 115 may couple with a ground shield portion of another via (not shown), or one or more pads, pins, or some other connection through the pre-preg layer(s) 135 such that the top layer 105 and/or bottom layer 115 may be coupled with a ground external to the package 100. In some embodiments, one or both of the pre-preg layer(s) may be some other electrically and/or thermally neutral dielectric material or some other material. In embodiments herein, the ground shield portion 125 and the via 120 in general may be referred to as "buried." Specifically, the ground shield portion 125 may extend through the majority of the substrate 190 with the exception of the pre-preg layers 135.

In some embodiments, the signal portion 150 may be hollow or semi-hollow, and filled with a dielectrically and/or thermally neutral filler 155. In embodiments, the filler 155 may be the same or a similar material as resin 130. In some embodiments, the filler 155 may be either conductive or non-conductive. Generally, a non-conductive material may be used to control possible thermal expansion that may occur during manufacturing and/or use of the package 100.

The package 100 may further include a pad 165 on one or both sides of the substrate 190. As shown in FIG. 1, the pad(s) 165 may be directly electrically and physically coupled with the signal portion 150. Generally, the pad(s) 165 may be circular or have some other shape when viewed from the top of the package 100. In embodiments where the pad(s) 165 are circular, the pad(s) may have a diameter as indicated by Z, which may be larger than the diameter X of the signal portion 150. In embodiments, the diameter Z may be approximately 10 mils, though in other embodiments the pad(s) may have a higher or lower diameter. In embodiments, the pad(s) 165 may be formed of a conductive material such as copper. In some embodiments, the copper may include an additional plating finish of a material such as hard gold or electroless nickel immersion gold (ENIG). In other embodiments, the pad(s) 165 may be formed of some additional or alternative conductive material. Specifically, the pad(s) 165 may be configured to couple with some other substrate, pad, solder material, die, chip, package, or other computing element that is configured to provide an electrical signal to the pad 165. The signal may pass from one pad 165, along the signal portion 150, and to the other pad 165 where the signal may pass from the pad 165 to another substrate, pad, solder material, die, chip, package, etc.

Generally, as shown in FIG. 1, the ground shield portion 125 may be generally positioned within the substrate 190, that is coupled with the faces of the pre-preg layers 135 that are generally facing one another. By contrast, the pads 165 may be coupled with the outer portion of the substrate 190, that is coupled with the faces of the pre-preg layers 135 that are facing away from one another. The pads 165 and the ground shield portion 125 may be described as being not co-planar with one another in a direction perpendicular to the axis 170.

As noted above, previously it may have been difficult to manufacture packages that included sub 0.5 mm pitch coaxial vias with pads that were co-planar with the ground shield portion of the coaxial via. This difficulty may have been because, when the pads were co-planar with the signal portion, the pads may have forced the diameter of the ground shield portion to be larger than the diameter of the pads. This increase in diameter of the ground shield portion may have caused the overall diameter of the vias to be relatively large. The relatively large diameter of the vias may have resulted in significant structural instabilities due to lack of substrate webbing during the manufacturing process.

In embodiments, the combination of the external pads 165 and the buried ground shield portion 125 may allow the pads 165 to have as large of a diameter Z as necessary to conform the package 100 to manufacturing requirements or specifications, while eliminating or reducing size limitations that may be caused by the pads 165 being co-planar with the ground shield portion 125. Specifically, the diameter Z of the pads 165 may be as large as, or larger than, the diameter Y of the ground shield portion 125. Removing or reducing this size limitation may allow the diameter of the ground shield portion 125 to be reduced such that vias with a pitch of less than approximately 0.5 mm (e.g., 0.4 mm or less) may be manufactured and used in arrays such as ball grid arrays (BGAs).

FIG. 2-A through 2-F depict various stages of manufacturing a package such as package 100. Each element will not be repeated in each Figure for the sake of clarity. Additionally, as indicated for FIG. 1, where the image in the Figure is symmetrical and contains multiples of the same element, each multiple may not be numbered for the sake of clarity.

Initially, at FIG. 2-A, a top layer 205 and bottom layer 215 may be deposited on, laminated on, and/or otherwise formed or coupled with a substrate core layer 210. Top layer 205, bottom layer 215, and substrate core layer 210 may be respectively similar to top layer 105, bottom layer 115, and substrate core layer 110.

Next, as shown in FIG. 2-B, a hole 220 may be formed in the top layer 205, bottom layer 215, and substrate core layer 210, and plated to form ground shield portion 225. Ground shield portion 225 may be similar to ground shield portion 125. In embodiments, the hole 220 may be formed with a diameter of approximately may be approximately 13 mils, though in other embodiments the diameter of the ground shield portion 220 may be higher or lower]. For example, as described above, in some embodiments the diameter of the ground shield portion 220 may be between approximately 10 to approximately 15 mils. The specific placement and diameter of the hole may be based on a number of factors such as specific manufacturing tolerances of the substrate core 210, the desired use of the resultant package 100, the specific BGA pattern that was intended, the desired pitch of the vias on the package, and/or one or more other factors. In embodiments, the hole 220 may be drilled, etched, or formed by some other chemical, optical, and/or mechanical process. Additionally, although the ground shield portion 225 is described as being plated, in other embodiments the ground shield portion 225 may be formed through some other process such as sputtering, deposition, or some other process.

As shown in FIG. 2-C, the hole 220 may be at least partially or wholly filled with a resin 230, which may be similar to resin 130.

As shown in FIG. 2-D, pre-preg layers 235 and conductive metal layers 240 may be coupled with either side of the resin 230, the top layer 205, and the bottom layer 215. The pre-preg layers 235 may be similar to pre-preg layers 135 of FIG. 1. The conductive metal layers 240 may be, for example, copper, gold, aluminum, etc. as described above. In embodiments, the pre-preg layers 235 may be glued, laminated, or otherwise directly coupled with the top layer 205 and bottom layer 215. The conductive metal layers 240 may be glued, laminated, deposited, sputtered, or otherwise coupled directly with the pre-preg layers 235. In some embodiments, the conductive metal layers 240 may be coupled with the pre-preg layers 235 prior to coupling of the pre-preg layers 235 with the top layer 205 and/or bottom layer 215.

Subsequently, as shown in FIG. 2-E, a second hole 245 may be formed in the pre-preg layers 235, conductive metal layers 240, and resin 230. The hole 245 may be drilled, etched, or formed by some other chemical, laser, optical, and/or mechanical process. In embodiments, the hole 245 may have a diameter of approximately 5 mils. The hole may then be plated to form the signal portion 250. As shown in FIG. 2-E, the signal portion 250 may generally extend through the hole 245 and along the pre-preg layers. Generally, the signal portion 250 may be formed of the same or similar material as to that described for signal portion 150, above.

As shown in FIG. 2-F, the signal portion 250 may be filled with a filler 255, which may be similar to filler 155 above. The substrate may be plated with a further conductive metal layer 260 as depicted which may serve to form a conductive metal cap over the filler 255. The conductive metal layer 260 and the signal portion 250 may then be etched through mechanical, optical, and/or chemical means to form pad 165 and the resultant package 100 depicted in FIG. 1.

It will be understood that the process described above with respect to FIGS. 2-A through 2-F may be one example process, and in other embodiments certain elements may be formed in a different manner, or certain steps may be added or skipped.

As described above, in packages that include a plurality of vias with a relatively small pitch (e.g., less than 0.5 mm), the webbing between buried ground shields may become too thin for mechanical stiffness and/or support during the manufacturing process. One way to overcome this thinness may be to shrink the diameter of the ground shield portion of the coaxial vias; however, doing so may result in a significant decrease in impedance of the via, which may not be a desired outcome for signal integrity reasons. For example, the decreased impedance may be detrimental to the signal quality.

In embodiments, to increase mechanical support while not increasing the impedance, staged drilling may be used during the manufacturing process. Generally, a pattern such as a BGA pattern that includes a plurality of vias may be identified. A first portion of the plurality of vias, which may be non-adjacent vias, may be identified and drilled. The drilled vias may then be structurally reinforced, for example, through plating and/or the use of a resin material similar to resin 130. Then, a second portion of the plurality of vias, which may also be non-adjacent vias, may be identified and drilled.

Because only a few vias of the overall pattern are drilled at a time, the effective spacing between the vias during manufacturing may be increased. Thus, the webbing between the various vias may not be too thin or completely drilled away. As a result, the diameter of the ground shield portion of the various coaxial vias may be increased while reducing or eliminating any impedance discontinuities or increasing crosstalk.

Figure 3:
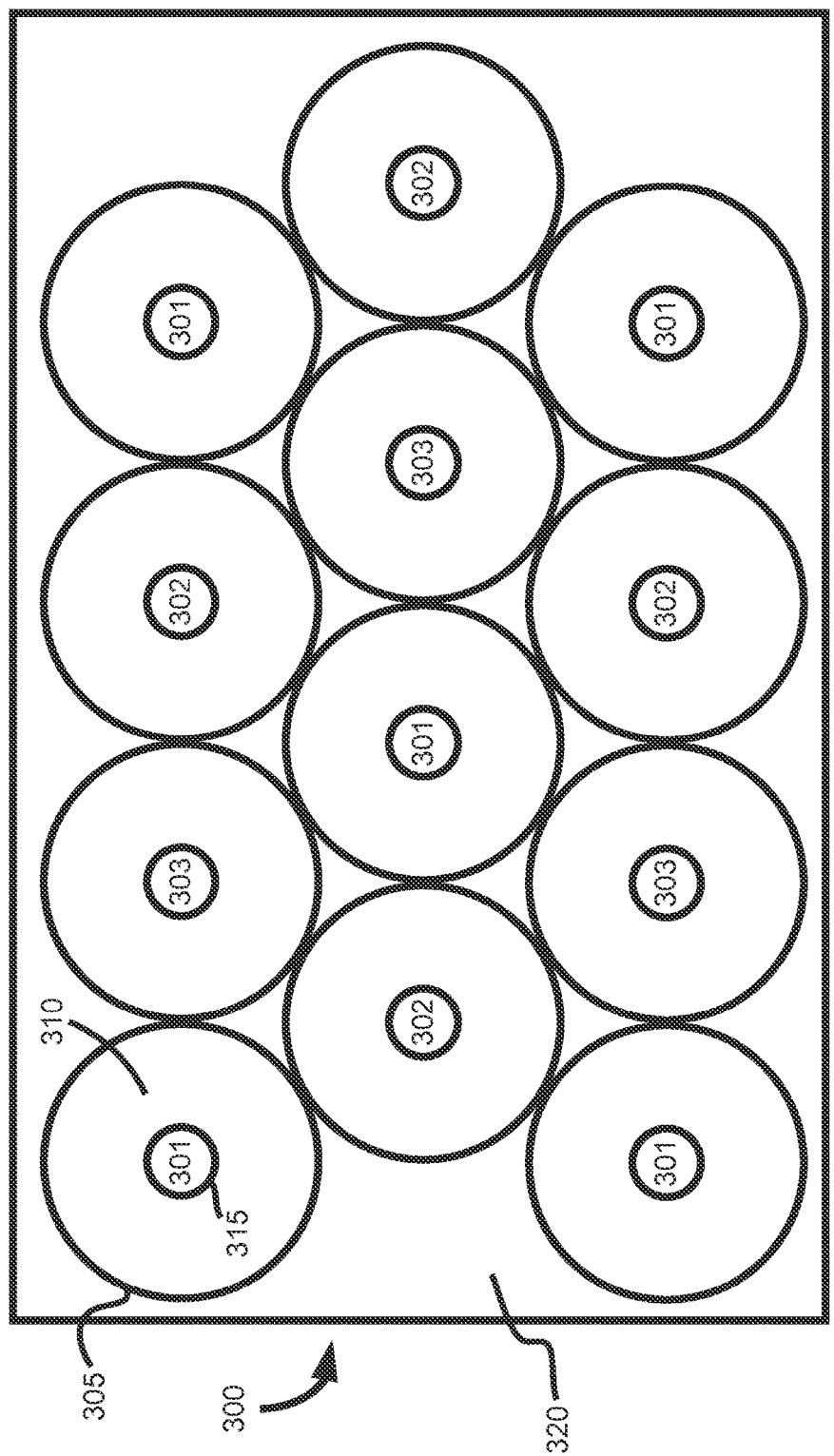
FIG. 3 is an example of a substrate with staged vias, in accordance with various embodiments.

FIG. 3 depicts a top-down example of a staged pattern by which various vias can be drilled. Specifically, the image depicts a cross-sectional top-down image along line A-A of FIG. 1. In embodiments, package 300 may include a substrate 320, which may be similar to substrate 190, and include a plurality of coaxial vias 301, 302, and 303, which may be similar to coaxial via 120. As described above, the substrate may be a substrate of a spacer, interposer, die, patch, PCB, and/or some other substrate.

Respective vias 301/302/303 may be coaxial and have a signal portion 315, which may be similar to signal portion 150, and a ground shield portion 305 which may be similar to ground shield portion 125. The vias 301/302/303 may further include a resin portion 310 that may be similar to resin 130. Certain elements such as the filler 155 may not be depicted for the sake of clarity in FIG. 3.

In embodiments, a first portion of the plurality of vias, for example, all vias 301, may be identified. As can be seen in FIG. 3, vias 301 may not be adjacent to one another. The vias 301 may be manufactured to a stage such as the stage depicted in at least FIG. 2-C. For example, a hole such as hole 220 may be drilled in each of vias 301 and the vias 301 may be filled with a resin such as resin 230. In other embodiments, the vias 301 may be fully formed as depicted in FIG. 1. In other embodiments, the vias 301 may be at a stage as shown in one of FIGS. 2-D through 2-F.

Subsequently, vias 302 may be identified. As can be seen in FIG. 3, vias 302 may not be adjacent to one another. The vias 302 may be manufactured similarly to vias 301 as described above. Finally, vias 303, which may also not be adjacent to one another, may be identified and manufactured similar to vias 301 as described above. In some embodiments, vias 301, 302, and 303 may be manufactured in a staged manner through the stage depicted in FIGS. 2-C and/or 2-D, and then the remainder of the manufacturing process (i.e., the stages depicted in FIGS. 2-E, 2-F, and the final stage depicted in FIG. 1) may be performed on all of the vias simultaneously. That is, the vias 301, 302, and 303 may be drilled and filled with resin in a staged manner, and then the formation of the signal portion 315 may be performed generally at the same time for each of vias 301, 302, and 303.

In embodiments, the pattern of vias 301/302/303 may be a BGA pattern that is to be formed for a set of given package requirements. Although only 12 vias are depicted in FIG. 3, it will be understood that other embodiments may have more or fewer vias. In some embodiments, the pattern may be a different type of pattern such as a land grid array (LGA) pattern or some other configuration of vias. In some embodiments, a greater number of portions of vias (i.e., 4, 5, 6, etc.) may be identified and processed in a staged manner. In some embodiments, the vias may be arranged in some other pattern such as a square grid or some other pattern. In those embodiments, a different number of portions of vias may be identified such that different vias in the respective portions may not be adjacent to one another.

As discussed earlier, previous techniques may have drilled all of the ground shield portions 305 of vias 301/302/303 generally concurrently. This concurrent drilling may have resulted in very little webbing between adjacent vias, which may have resulted in having to shrink the diameter of the ground shield portions to maintain structural integrity during manufacturing. However, this shrinking may have resulted in a lower impedance for the via and/or caused shorts between the signal portions and the ground shield portions of the vias. The lower impedance may have meant that any signal in the via that was not matched to the lower impedance may have caused an impedance discontinuity, which would result in a signal reflection occurring in the signal portion of the via. Such a signal reflection may have been problematic in high speed designs.

By drilling the vias 301/302/303 in a staged manner, the structural integrity during manufacturing may be maintained, which may allow the diameter of the ground shield portions 305 to be maintained or increased. This larger diameter may therefore increase the impedance of the vias 301/302/303, thus decreasing or eliminating the discontinuity.

Figure 4:
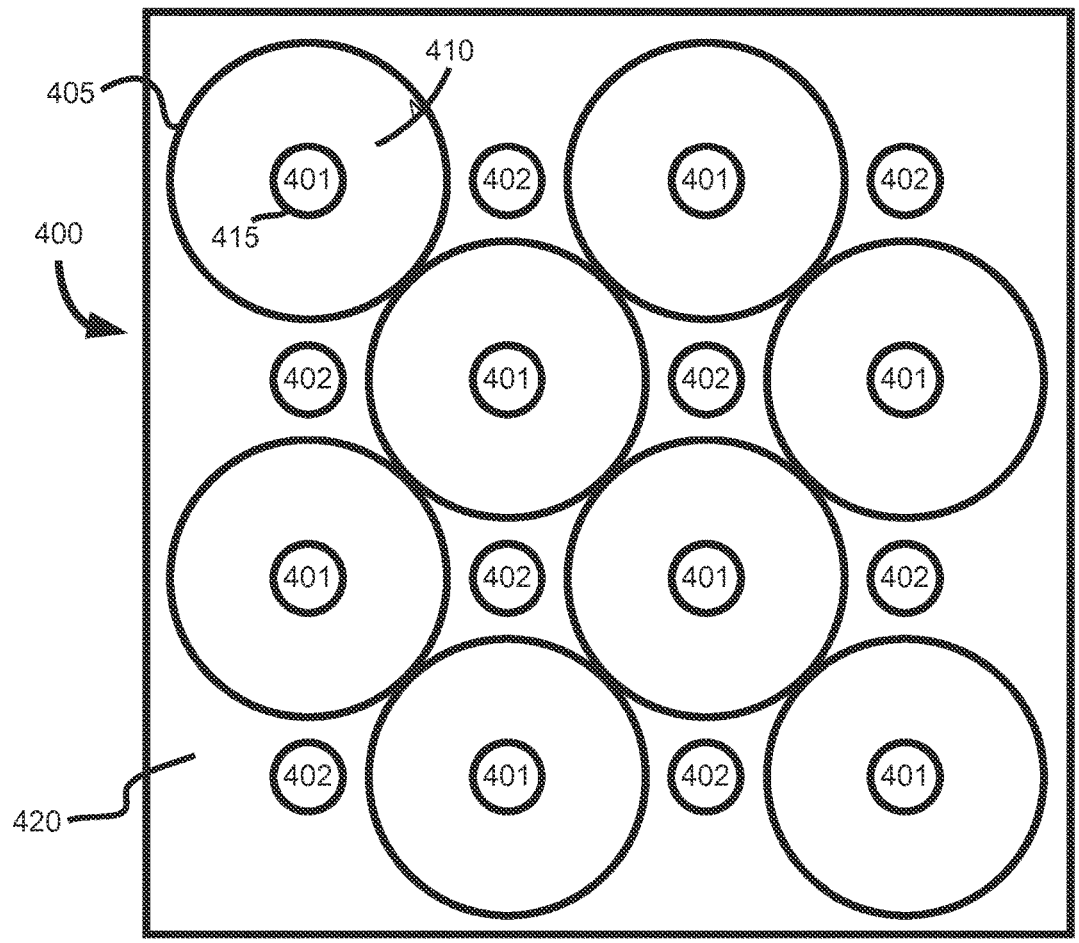
FIG. 4 is an example of a substrate with skipped vias, in accordance with various embodiments.

FIG. 4 depicts an alternate top-down example of a skipped pattern by which various vias can be drilled. Similarly to FIG. 3, the image specifically depicts a cross-sectional top-down image along line A-A of FIG. 1. In embodiments, package 400 may include a substrate 420, which may be similar to substrate 320. The package 400 may further include a plurality of vias 401 and 402. Vias 401 may be coaxial and have a signal portion 415, ground shield portion 405, and resin 410, which may be respectively similar to signal portion 315, ground shield portion 305, and resin 310. Vias 402 may not be coaxial.

In embodiments, the ground shield portion 405 of the coaxial vias 401 may be drilled concurrently with the non-coaxial vias 402, or in a staged manner as described above. By having only part of the pattern of vias by coaxial 401 and another part of the vias be non-coaxial 402, the ground shield portions 405 of the coaxial vias 401 may serve to effectively "wall off" the non-coaxial vias 402 from one another such that via crosstalk may be reduced or eliminated.

It will be understood that FIG. 3 depicts a via pattern that may be considered to be "hexagonal" and FIG. 4 depicts a via pattern that may be considered to be a "square" pattern. That is, the square pattern may be generally aligned along an X and a Y axis as shown. However, it will be understood that in other embodiments the techniques described above with respect to FIGS. 3 and 4 may be applied to different patterns. For example, the staged technique of FIG. 3 may be applied to a square pattern of vias such as that shown in FIG. 4, or some other pattern. Additionally, the skipped technique of FIG. 4 may be applied to a hexagonal pattern of vias such as that shown in FIG. 3, or some other pattern.

Additionally, to the extent that certain of the coaxial vias such as vias 301, 302, and 303 are shown as adjacent to one another, in some embodiments the staged drilling technique may have some amount of imprecision which may result in the ground shield portions 305 of one or more of the vias 301, 302, and/or 303 at least partially overlapping one another.

Figure 5:
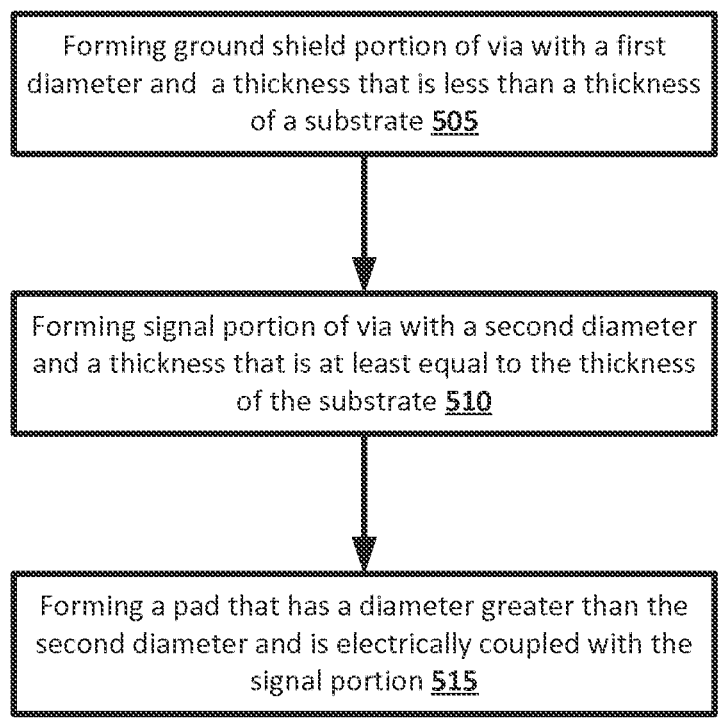
FIG. 5 is an example process for making the coaxial via of FIG. 1, in accordance with various embodiments.

FIG. 5 is an example process for making a coaxial via such as coaxial via 120 of FIG. 1, in accordance with various embodiments. Specifically, the process may include forming, at 505, a ground shield portion of a via such as ground shield portion 125 of via 120 with a first diameter such as diameter Y. The via may have a thickness that is less than a thickness of a substrate such as substrate 190, as depicted in FIG. 1.

The process may then include forming a signal portion such as signal portion 150 at 510. The signal portion may have a diameter such as diameter X and a thickness that is at least equal to the thickness of the substrate, as shown in FIG. 1.

The process may then include forming, at 515 a pad such as pad 165 that has a diameter such as diameter Z. The diameter Z may be greater than diameter X as shown in FIG.

1, and the pad may be electrically coupled with the signal portion of the via, as shown in FIG. 1.

Figure 6:
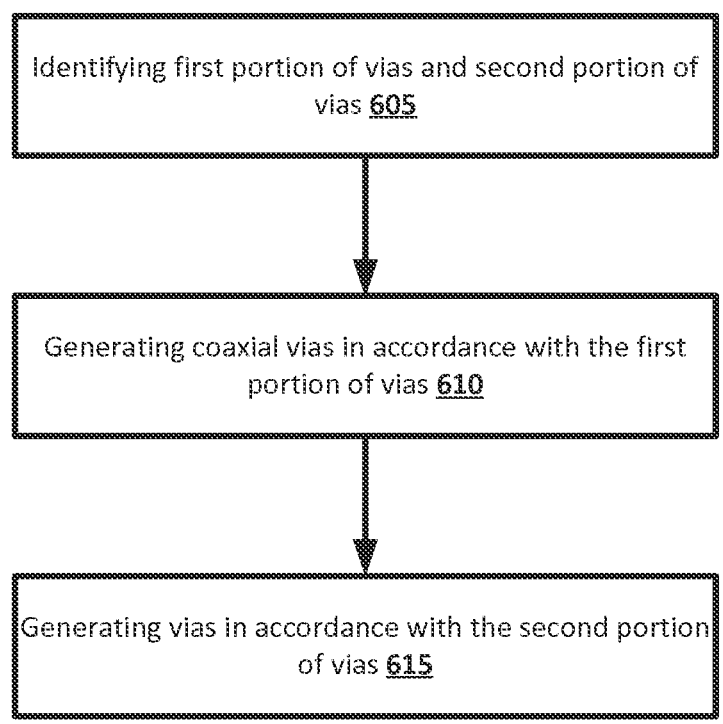
FIG. 6 is an example process for making the substrates of FIG. 3 or 4, in accordance with various embodiments.

FIG. 6 is an example process for making the substrates of FIG. 3 or 4, in accordance with various embodiments. The process may include, for example, identifying at least a first portion of vias and a second portion of vias at 605. The first portion of vias may be, for example, 301 or 401, and the second portion of vias may be, for example 302 or 402. In embodiments, a third portion such as 303 or further additional portions may also be identified. However, for the sake of conciseness, only first portion and second portion will be described with respect to this example.

Next, the process may include generating coaxial vias in accordance with the first portion of vias at 610. The coaxial vias may be similar to via 120, and may be vias 301 or 401 as shown in FIG. 3 or 4 respectively. The process may then include generating vias in accordance with the second portion of vias at 615. In embodiments, the vias generated in accordance with the second portion of vias may be coaxial such as vias 302 or 120, or the second portion of vias may be non-coaxial such as vias 402.

In embodiments where the second portion of vias are coaxial, element 615 may be performed subsequent to element 610. In embodiments where the second portion of vias are non-coaxial, element 615 may be performed subsequent to or concurrently with element 610, as described above. In some embodiments, certain of the elements may be performed out of order, or split up. For example, in some embodiments, the first portion of vias may be identified and generated prior to the identification of the second portion of vias. Additionally, although the above FIGS. 3-6 are described with respect to plural vias, in some embodiments each portion of vias in the plurality of vias may include only a single via.

Figure 7:
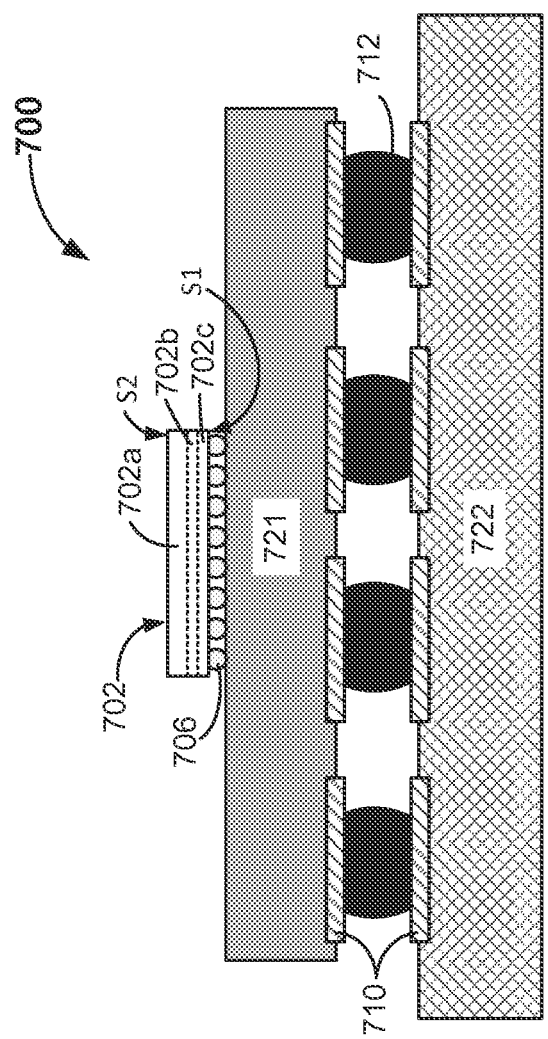
FIG. 7 schematically illustrates a cross-section side view of an integrated circuit (IC) assembly that may include the coaxial via of FIG. 1 or the substrates of FIG. 3 or 4, in accordance with some embodiments.

FIG. 7 schematically illustrates a cross-section side view of an integrated circuit (IC) assembly 700 that may include one or more of the vias 120, 301/302/303, and/or 401/402. In some embodiments, the IC assembly 700 may include one or more dies (hereinafter "die 702") electrically and/or physically coupled with a package substrate 721. In some embodiments, the package substrate 721 may be electrically coupled with a PCB 722, as can be seen. In some embodiments, the IC assembly 700 may include one or more of the die 702, package substrate 721 and/or PCB 722, according to various embodiments. In some embodiments, the die 702, package substrate 721, and/or PCB 722 may include a substrate such as substrates 190, 320 and/or 420, with respective vias 120, 301/302/303, and/or 401/402 as described above.

The die 702 may represent a discrete product made from a semiconductor material (e.g., silicon) using semiconductor fabrication techniques such as thin film deposition, lithography, etching and the like used in connection with forming complementary metal-oxide semiconductor (CMOS) devices. In some embodiments, the die 702 may be, include, or be a part of a processor, memory, system on a chip (SoC) or application-specific IC (ASIC). In some embodiments, an electrically insulative material such as, for example, molding compound or underfill material (not shown) may encapsulate at least a portion of the die 702 and/or die-level interconnect structures 706.

The die 702 can be attached to the package substrate 721 according to a wide variety of suitable configurations including, for example, being directly coupled with the package substrate 721 in a flip-chip configuration, as depicted. In the flip-chip configuration, an active side, S1, of the die 702 including circuitry is attached to a surface of the package substrate 721 using die-level interconnect structures 706 such as bumps, pillars, or other suitable structures that may also electrically couple the die 702 with the package substrate 721. The active side S1 of the die 702 may include active devices such as, for example, transistor devices. An inactive side, S2, may be disposed opposite to the active side S1, as can be seen.

The die 702 may generally include a semiconductor substrate 702a, one or more device layers (hereinafter "device layer 702b") and one or more interconnect layers (hereinafter "interconnect layer 702c"). The semiconductor substrate 702a may be similar to one or more of substrates 190, 320 and/or 420, and be substantially composed of a bulk semiconductor material such as, for example, silicon, in some embodiments. The device layer 702b may represent a region where active devices such as transistor devices are formed on the semiconductor substrate. The device layer 702b may include, for example, transistor structures such as channel bodies and/or source/drain regions of transistor devices. The interconnect layer 702c may include interconnect structures (e.g., electrode terminals) that are to route electrical signals to or from the active devices in the device layer 702b. For example, the interconnect layer 702c may include horizontal lines (e.g., trenches) and/or vertical plugs (e.g., vias) or other suitable features to provide electrical routing and/or contacts. In embodiments, the interconnect layer may include one or more of vias 120, 301/302/303, and 401/402 and/or one or more of top layer 105 and bottom layer 115.

In some embodiments, the die-level interconnect structures 706 may be electrically coupled with the interconnect layer 702c and configured to route electrical signals between the die 702 and other electrical devices. The electrical signals may include, for example, input/output (I/O) signals and/or power/ground signals that are used in connection with operation of the die 702.

In some embodiments, the package substrate 721 is an epoxy-based laminate substrate having a core and/or build-up layers such as, for example, an Ajinomoto Build-up Film (ABF) substrate. The package substrate 721 may include other suitable types of substrates in other embodiments including, for example, substrates formed from glass, ceramic, or semiconductor materials. The core may be similar to, for example, substrate core 110.

The package substrate 721 may include electrical routing features configured to route electrical signals to or from the die 702. The electrical routing features may include, for example, pads or traces (not shown) disposed on one or more surfaces of the package substrate 721 and/or internal routing features (not shown) such as, for example, trenches, vias or other interconnect structures to route electrical signals through the package substrate 721. For example, in some embodiments, the package substrate 721 may include electrical routing features such as pads (not shown) configured to receive the respective die-level interconnect structures 706 of the die 702.

The PCB 722 may include an electrically insulative material such as an epoxy laminate. For example, the PCB 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated to together using an epoxy resin pre-preg material. Interconnect structures (not shown) such as traces, trenches, or vias may be formed through the electrically insulating layers to route the electrical signals of the die 702 through the PCB 722. The PCB 722 may be composed of other suitable materials in other embodiments. In some embodiments, the PCB 722 is a motherboard.

Package-level interconnects such as, for example, solder balls 712 may be coupled to one or more pads (hereinafter "pads 710") on the package substrate 721 and/or on the PCB 722 to form corresponding solder joints that are configured to further route the electrical signals between the package substrate 721 and the PCB 722. The pads 710 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 721 with the PCB 722 may be used in other embodiments.

The IC assembly 700 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 702 and other components of the IC assembly 700 may be used in some embodiments.

Figure 8:
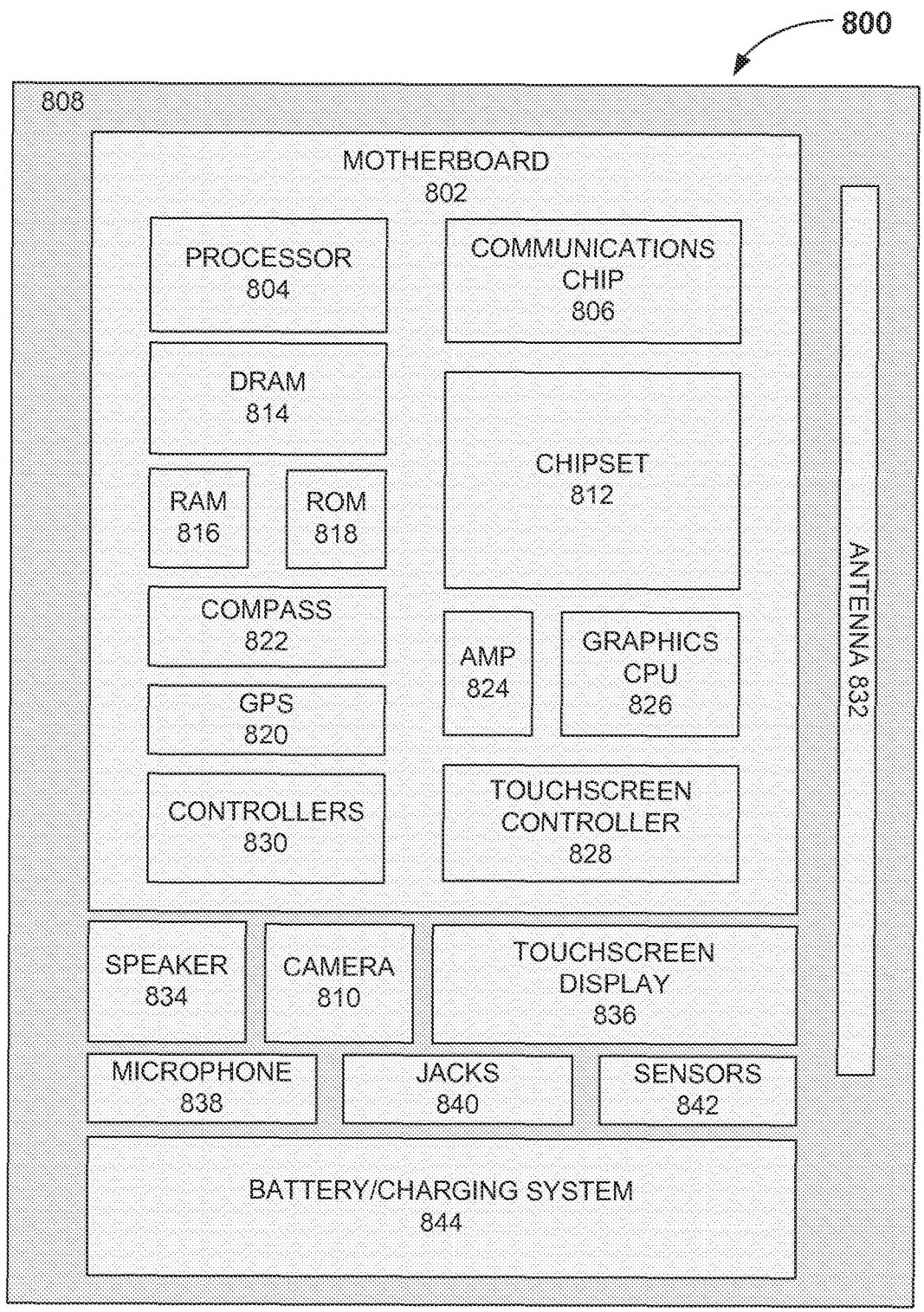
FIG. 8 schematically illustrates a computing device that may include one or more of the coaxial vias of FIG. 1 or the substrates of FIG. 3 or 4, in accordance with some embodiments.

Embodiments of the present disclosure may be implemented into a system using any suitable hardware and/or software to configure as desired. FIG. 8 schematically illustrates a computing device 800 that may include one or more of vias 120, 301/302/303, and/or 401 and 402, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, microelectrical mechanical sensor (MEMS) sensors, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as WiGig, Wi-Fi and Bluetooth and a second communication chip 806 may be dedicated to longer range wireless communications such as GPS, EDGE, GPRS, CDMA, WiMAX, LTE, EV-DO, and others.

The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

In various embodiments, the computing device 800 may include one or more coolers coupled to the various components described herein, including housing 808, motherboard 802, processor 804, DRAM 814, random access memory (RAM) 816, ROM 818, compass 822, GPS 820, controllers 830, communications chip 806, chipset 812, amp 824, graphics CPU 826, touchscreen controller 828, speaker 834, camera 810, touchscreen display 836, microphone 838, jacks 840, sensors 842, battery/charging system 844, and/or antenna 832.

The following paragraphs provide examples of various ones of the embodiments disclosed herein.

Example 1 may include a substrate comprising: a dielectric layer at an outer side of the substrate; an axis that is perpendicular to the dielectric layer; and a via that includes: a signal portion with a signal axis that is coaxial with the axis; a pad that is coupled with the signal portion and is generally parallel to the dielectric layer; and a is ground shield portion with a ground axis that is coaxial with the axis and the signal axis, wherein the ground shield portion is disposed around the signal portion, wherein the ground shield portion and the pad are not coplanar in a direction perpendicular to the axis.

Example 2 may include the substrate of example 1, further comprising a resin portion disposed between the signal portion and the ground shield portion.

Example 3 may include the substrate of example 1, wherein the signal portion is a first signal portion, the signal axis is a first signal axis, the pad is a first pad, the ground shield portion is a first ground shield portion, and the ground axis is a first ground axis, the substrate further comprising a second via that includes: a second signal portion with a second signal axis that is parallel with the axis; a second pad that is coupled with the second signal portion and is generally coplanar with the first pad; and a second ground shield portion with a second ground axis that is parallel with the axis and coaxial with the second signal axis, wherein the second ground shield portion is disposed around the second signal portion, and wherein the second ground shield portion and the second pad are not coplanar in a direction perpendicular to the axis.

Example 4 may include the substrate of example 3, wherein the first ground shield portion is directly physically coupled with the second ground shield portion.

Example 5 may include the substrate of example 4, wherein a distance between a center of the first pad and a center of the second pad is less than approximately 0.5 millimeters (mm).

Example 6 may include the substrate of any of examples 1-5, wherein the signal portion is a conductive signal portion electrically coupled with the pad.

Example 7 may include a method comprising: forming a ground shield portion of a via between a first side and a second side of a substrate, the ground shield portion having a first diameter and having a length along an axis of the ground shield portion that is less than a thickness of the substrate from the first side to the second side; forming a signal portion of the via between the first side and the second side of the substrate, the signal portion having a second diameter that is less than the first diameter and having an axis that is coaxial with the axis of the ground shield portion, wherein the signal portion has a length that is at least the thickness of the substrate; and forming a pad on the first side of the substrate, the pad having a diameter greater than the second diameter and being electrically coupled with the signal portion and electrically isolated from the ground shield portion.

Example 8 may include the method of example 7, wherein the pad is at a first plane parallel with the first side, and the ground shield portion is at a second plane parallel with the first side, and the first plane is not coplanar with the second plane.

Example 9 may include the method of example 7, wherein forming the ground shield portion includes drilling a cavity in at least a portion of the substrate and plating the cavity with a conductive material.

Example 10 may include the method of example 9, further comprising filling, subsequent to the plating, the cavity with a resin material.

Example 11 may include the method of example 10, wherein forming the signal portion includes drilling a cavity in the resin material and plating the cavity with a conductive material.

Example 12 may include the method of any of examples 7-11, wherein the axis of the signal portion is approximately 0.4 mm from an axis of another via.

Example 13 may include a method comprising: identifying a first portion of vias and a second portion of vias in a pattern of vias that are to be formed in a substrate, wherein the first portion of vias is less than all of the vias in the pattern and is different than the second portion of vias; generating, in the substrate, first coaxial vias in accordance with the first portion of the vias in the pattern of vias that are to be formed in the substrate; and generating, in the substrate subsequent to the generating the first coaxial vias, second vias in accordance with the second portion of the vias in the pattern of vias that are to be formed in the substrate.

Example 14 may include the method of example 13, wherein the pattern is a hex grid pattern.

Example 15 may include the method of example 14, wherein vias in the first portion of vias are not adjacent to one another in the hex grid pattern.

Example 16 may include the method of example 13, wherein the pattern is a square grid pattern wherein the vias in the pattern are arranged according to an x axis and a y axis that is perpendicular to the x axis.

Example 17 may include the method of example 16, wherein vias in the first portion of vias are not adjacent to one another along the x axis or the y axis.

Example 18 may include the method of any of examples 13-17, wherein the second vias are second coaxial vias.

Example 19 may include the method of example 18, wherein respective ground shield portions of the first coaxial vias and second coaxial vias are physically and electrically coupled with one another.

Example 20 may include the method of any of examples 13-17, wherein a distance from a center of a first via in the pattern of vias and a center of a second via in the pattern of vias is less than 0.5 millimeters.

Example 21 may include a method comprising: identifying a first portion of coaxial vias and a second portion of non-coaxial vias in a pattern of vias that are to be formed in a substrate, wherein non-coaxial vias in the second portion of non-coaxial vias are not adjacent to one another in the pattern; generating, in the substrate, first coaxial vias in accordance with the first portion of coaxial vias; and generating, in the substrate, second non-coaxial vias in accordance with the second portion of non-coaxial vias.

Example 22 may include the method of example 21, wherein the pattern is a hex grid pattern.

Example 23 may include the method of example 21, wherein the pattern is a square grid pattern wherein the vias in the pattern are arranged according to an x axis and a y axis that is perpendicular to the x axis.

Example 24 may include the method of example 21, wherein respective ground shield portions of at least two coaxial vias in the first coaxial vias are physically and electrically coupled with one another.

Example 25 may include the method of any of examples 21-24, wherein a distance from a center of a first via in the pattern of vias and a center of a second via in the pattern of vias is less than 0.5 millimeters.

What is claimed is:
1. A substrate comprising:
a dielectric layer at an outer side of the substrate;
an axis that is perpendicular to the dielectric layer; and
a via that includes:
a signal portion with a signal axis that is coaxial with the axis;

a pad that is coupled with the signal portion and is generally parallel to the dielectric layer;

a ground shield portion with a ground axis that is coaxial with the axis and the signal axis, wherein the ground shield portion is disposed around the signal portion, wherein the ground shield portion and the pad are not coplanar in a direction perpendicular to the axis; and a resin portion disposed between the signal portion and the ground shield portion.

2. The substrate of claim 1, wherein the signal portion is a first signal portion, the signal axis is a first signal axis, the pad is a first pad, the ground shield portion is a first ground shield portion, and the ground axis is a first ground axis, the substrate further comprising a second via that includes:

a second signal portion with a second signal axis that is parallel with the axis;

a second pad that is coupled with the second signal portion and is generally coplanar with the first pad; and a second ground shield portion with a second ground axis that is parallel with the axis and coaxial with the second signal axis, wherein the second ground shield portion is disposed around the second signal portion, and wherein the second ground shield portion and the second pad are not coplanar in a direction perpendicular to the axis.

3. The substrate of claim 2, wherein the first ground shield portion is directly physically coupled with the second ground shield portion.

4. The substrate of claim 3, wherein a distance between a center of the first pad and a center of the second pad is less than approximately 0.5 millimeters (mm).

5. The substrate of claim 1, wherein the signal portion is a conductive signal portion electrically coupled with the pad.

6. A method comprising:

forming a ground shield portion of a via between a first side and a second side of a substrate, the ground shield portion having a first diameter and having a length along an axis of the ground shield portion that is less than a thickness of the substrate from the first side to the second side;

forming a signal portion of the via between the first side and the second side of the substrate, the signal portion having a second diameter that is less than the first diameter and having an axis that is coaxial with the axis of the ground shield portion, wherein the signal portion has a length that is at least the thickness of the substrate; and forming a pad on the first side of the substrate, the pad having a diameter greater than the second diameter and being electrically coupled with the signal portion and electrically isolated from the ground shield portion.

7. The method of claim 6, wherein the pad is at a first plane parallel with the first side, and the ground shield portion is at a second plane parallel with the first side, and the first plane is not coplanar with the second plane.

8. The method of claim 6, wherein forming the ground shield portion includes drilling a cavity in at least a portion of the substrate and plating the cavity with a conductive material.

9. The method of claim 8, further comprising filling, subsequent to the plating, the cavity with a resin material.

10. The method of claim 9, wherein forming the signal portion includes drilling a cavity in the resin material and plating the cavity with a conductive material.

11. The method of claim 6, wherein the axis of the signal portion is approximately 0.4 mm from an axis of another via.

12. A method comprising:

identifying a first portion of vias and a second portion of vias in a pattern of vias that are to be formed in a substrate, wherein the first portion of vias is less than all of the vias in the pattern and is different than the second portion of vias;

generating, in the substrate, first coaxial vias in accordance with the first portion of the vias in the pattern of vias that are to be formed in the substrate; and generating, in the substrate subsequent to the generating the first coaxial vias, second vias in accordance with the second portion of the vias in the pattern of vias that are to be formed in the substrate.

13. The method of claim 12, wherein the pattern is a hex grid pattern.

14. The method of claim 13, wherein vias in the first portion of vias are not adjacent to one another in the hex grid pattern.

15. The method of claim 12, wherein the pattern is a square grid pattern wherein the vias in the pattern are arranged according to an x axis and a y axis that is perpendicular to the x axis.

16. The method of claim 15, wherein vias in the first portion of vias are not adjacent to one another along the x axis or the y axis.

17. The method of claim 12, wherein the second vias are second coaxial vias.

18. The method of claim 17, wherein respective ground shield portions of at least two coaxial vias in the first coaxial vias and second coaxial vias are physically and electrically coupled with one another.

19. The method of claim 12, wherein a distance from a center of a first via in the pattern of vias and a center of a second via in the pattern of vias is less than 0.5 millimeters.

* * * * *